United States Patent
Hewett et al.

(10) Patent No.: US 6,664,013 B1
(45) Date of Patent: Dec. 16, 2003

(54) METHODS OF CHARACTERIZING DEVICE PERFORMANCE BASED UPON THE DURATION OF AN ENDPOINTED PHOTORESIST DEVELOP PROCESS, AND SYSTEM FOR ACCOMPLISHING SAME

(75) Inventors: Joyce S. Oey Hewett, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 38 days.

(21) Appl. No.: 10/045,536

(22) Filed: Nov. 7, 2001

(51) Int. Cl.$^7$ .............................. G03F 7/20; G03F 7/30; G03F 7/16; G03F 7/38; G03F 7/40
(52) U.S. Cl. .................... 430/30; 430/311; 430/313; 430/325; 430/326; 396/578
(58) Field of Search .................... 430/30, 311, 313; 430/325, 326; 396/578

(56) References Cited

U.S. PATENT DOCUMENTS

| | | | | |
|---|---|---|---|---|
| 4,647,172 A | * | 3/1987 | Batchelder et al. | 430/30 |
| 4,857,430 A | * | 8/1989 | Millis et al. | 430/30 |
| 4,998,021 A | * | 3/1991 | Mimasaka | 356/357 |
| 5,292,605 A | * | 3/1994 | Thomson | 430/30 |
| 5,427,878 A | * | 6/1995 | Corliss | 430/30 |
| 2002/0015904 A1 | * | 2/2002 | Hayashi et al. | 430/30 |
| 2002/0037462 A1 | * | 3/2002 | Ogata et al. | 430/30 |

* cited by examiner

Primary Examiner—Richard L. Schilling
(74) Attorney, Agent, or Firm—Williams, Morgan & Amerson, P.C.

(57) ABSTRACT

In one illustrative embodiment, the method comprises initiating a develop process on a layer of photoresist formed above a wafer, indicating an endpoint of the develop process, determining a duration of the endpoint develop process, and determining if the determined duration of the develop process is not within a preselected range. In another aspect, the present invention is directed to a system that comprises a develop station for performing a develop process on a layer of photoresist formed above a wafer, a develop endpoint detector for indicating an endpoint of the develop process, and a controller for determining if a duration of the develop process is not within a preselected range.

35 Claims, 2 Drawing Sheets

6,664,013 B1

METHODS OF CHARACTERIZING DEVICE PERFORMANCE BASED UPON THE DURATION OF AN ENDPOINTED PHOTORESIST DEVELOP PROCESS, AND SYSTEM FOR ACCOMPLISHING SAME

BACKGROUND OF THE INVENTION

1. Field of the Invention

This invention relates generally to semiconductor fabrication technology, and, more particularly, to methods of characterizing device performance based upon the duration of an endpointed photoresist develop process, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, or the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11, such as doped-silicon. The substrate 11 may be doped with either N-type or P-type dopant materials. The transistor 10 may have a doped-polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modem semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor processing involves, among other things, the formation of layers of various materials, e.g., polysilicon, insulating materials, etc., and selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., must be formed to very precisely controlled dimensions. Such dimensions are sometimes referred to as the critical dimension (CD) of the feature. It is very important in modem semiconductor processing that features be formed as accurately as possible due to the reduced size of those features in modem integrated circuit devices. For example, gate electrodes may now be patterned to a width 12 that is approximately 0.18 $\mu$m (1800 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Moreover, it is also desirable that manufacturing operations produce such features in a consistent, reliable and predictable manner. That is, it is desirable that features be formed in a manner such that there is little variation in final feature sizes, despite forming millions of such features on different substrates using different process tools to form such features.

Photolithography is a process typically employed in semiconductor manufacturing. Photolithography generally involves forming a patterned layer of photoresist above a layer of material that is desired to be patterned using the patterned photoresist layer as a mask. In general, the pattern desired to be formed in the underlying layer of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist reflecting the pattern on the reticle. This patterned layer of photoresist is then used as a mask in subsequent etching processes, wet or dry, performed on the underlying layer of material, e.g., a layer of polysilicon, metal or insulating material, to transfer the desired pattern to the underlying layer.

Various methods may be used to develop the layer of photoresist, e.g., immersion, spray and puddle-type methods. In immersion developing, a lot of wafers may be immersed and agitated in a bath of the appropriate developer. In more modern semiconductor manufacturing facilities, a spray development process may be employed on either a single wafer basis or a lot basis. In some systems, the wafer may be spinning as the developer is sprayed on the wafer. In puddle-type systems, a puddle of developer is dispensed onto a stationary wafer and remains there for the desired duration. Various combinations of such systems may also be employed, e.g., spray-puddle, double-puddle, puddle-spray-puddle. All such develop systems, and their operation, are known to those skilled in the art.

Traditionally, the develop process is a timed process, i.e., it is performed for a fixed duration in accordance with a particular process recipe. The develop process recipe may be repeated on many wafers as they are processed. In some cases, the duration of the develop process may be adjusted by the appropriate process engineer. However, in some develop systems, the develop process may be an endpoint process instead of a timed process. That is, a metrology tool is used to determine when the develop process has removed substantially all of the desired photoresist material.

One problem that exists with existing photolithography processes is that, at the point in the process where the photoresist is developed, the desired dimensions of the feature formed in the layer of photoresist may be changed or eroded due to excessive or insufficient time in the develop bath and/or variations in the chemistry used in the bath, etc. The problem may cause features in the underlying process layer to also be formed to dimensions that are different from those anticipated by the design process. For example, in forming line-type features, e.g., a gate electrode, excessive consumption of the feature formed in the layer of photoresist may lead to devices with gate electrodes having critical dimensions that are too small. While such a situation may, at least theoretically, increase the operating speed of the transistor by reducing the channel length, such a reduced size may also result in increased leakage currents and excessive power consumption, both of which are undesirable in modern integrated circuit devices. With respect to hole-type features, such excessive consumption results in holes in the process layer being formed to dimensions greater than anticipated by the design process. This may also be problematic given the densely packed nature of semiconductor devices.

Given the continual reduction of feature sizes in modem integrated circuit devices, it continues to be very important that feature sizes be defined as accurately as possible, and that such processes be repeatable. More particularly, given the variations in the development process, e.g., duration, it is very important to understand what effects, if any, such variations may ultimately have on device performance characteristics. Moreover, depending upon the particular application, subsequent process operations may have to be adjusted to compensate for such variations in the development process.

The present invention is directed to a method and system that may solve, or at least reduce, some or all of the aforementioned problems.

SUMMARY OF THE INVENTION

In general, the present invention is directed to methods of characterizing device performance based upon the duration of an endpointed photoresist develop process, and a system for accomplishing same. In one illustrative embodiment, the method comprises initiating a develop process on a layer of photoresist formed above a wafer, indicating an endpoint of the develop process, determining a duration of the endpoint develop process, and determining if the determined duration of the develop process is not within a preselected range. In further embodiments, the method further comprises predicting an electrical performance characteristic of an integrated circuit device to be formed on the wafer and/or adjusting one or more parameters of additional processing operations to be performed on the wafer or on other subsequently processed wafers based upon the determined duration of the endpoint develop process.

In another aspect, the present invention is directed to a system that comprises a develop station for performing a develop process on a layer of photoresist formed above a wafer, a develop endpoint detector for indicating an endpoint of the develop process, and a controller for determining if a duration of the develop process is not within a preselected range.

BRIEF DESCRIPTION OF THE DRAWINGS

The invention may be understood by reference to the following description taken in conjunction with the accompanying drawings, in which like reference numerals identify like elements, and in which.

Figure 1:
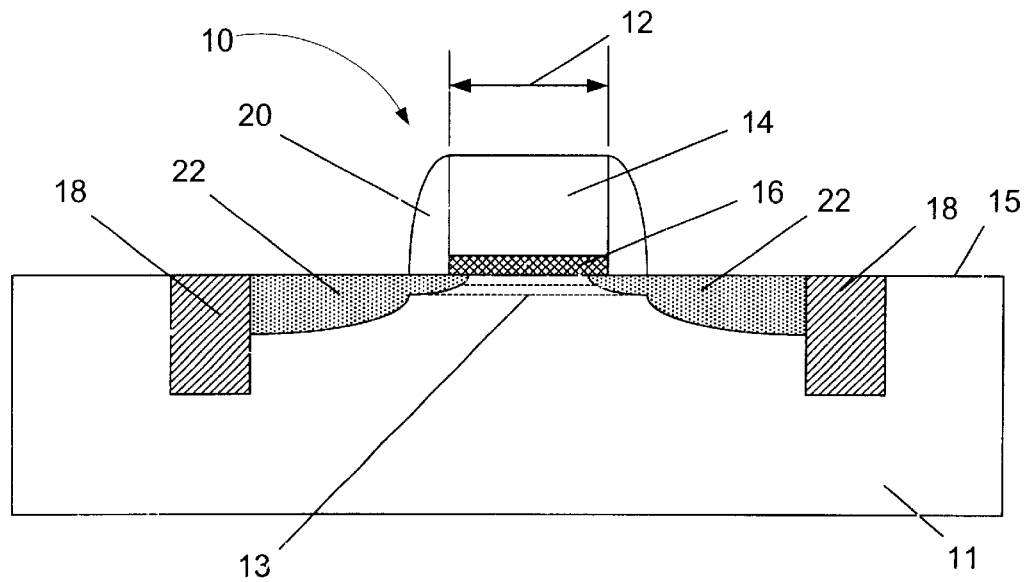
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, the various components depicted in the illustrative system of the present invention do not depict all of the supporting utilities, devices and structures of such components for purposes of clarity. Nevertheless, the attached drawings are included to describe and explain illustrative examples of the present invention.

In general, the present invention is directed to a method of characterizing device performance based upon the duration of an endpointed photoresist develop process, and a system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above a process layer in which a feature, e.g., a metal line, a gate electrode, an opening in a layer of insulating material, will be formed. Thereafter, the layer of photoresist is subjected to a stepper exposure process, a post-exposure bake process and a develop process to form a pattern in the layer of photoresist that is desired to be transferred into the underlying process layer. Then, using one or more etching processes, the underlying process layer is etched using the patterned layer of photoresist as a mask, thereby resulting in a patterned process layer that replicates the pattern formed in the layer of photoresist.

Figure 2:
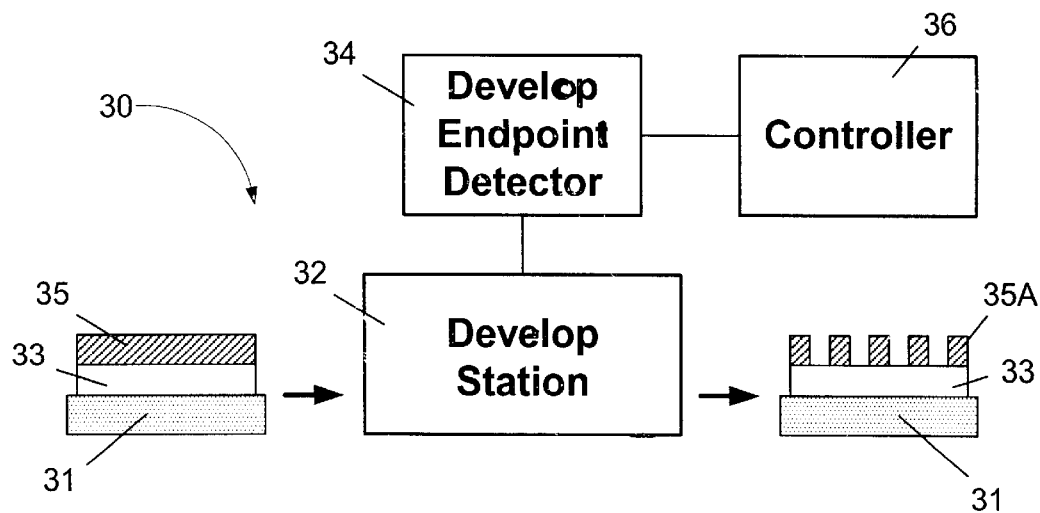
FIG. 2 depicts an illustrative embodiment of a system in accordance with one embodiment of the present invention.

FIG. 2 depicts an embodiment of a system 30 in accordance with one illustrative embodiment of the present invention. As shown therein, the system 30 is comprised of a develop station 32, a develop endpoint detector 34 and a controller 36. Also depicted in FIG. 2 is a wafer 31 having a process layer 33 formed thereabove, and a layer of photoresist 35 formed above the process layer 33. The substrate 31 to the left of the develop station 32 is depicted at the point in processing whereby the layer of photoresist 35 has been subjected to an exposure process in a stepper (not shown) and a post-exposure bake process, i.e., it is depicted at the point in processing where a develop process will be performed to remove the relatively soluble portions of the layer of photoresist 35.

In general, the photoresist layer 35 will be subjected to a develop process in the develop station 32 that will result in a patterned layer of photoresist 35A, as depicted in FIG. 2. The patterned layer of photoresist 35A may be used as a mask in subsequent wet or dry etching processes performed to form features in the underlying process layer 33. The develop endpoint detector 34 may be used to detect the endpoint of the develop process performed in the develop station 32. The controller 36 is, in general, used to monitor the duration of the develop process. The system 30 depicted in FIG. 2 may be used in employing several inventive methods that will be described in greater detail later in this application.

The develop station 32 is intended to be representative of any type of station or processing tool whereby the layer of photoresist 35 may be developed such that a patterned layer of photoresist 35A is formed. The develop station 32 may be a stand-alone tool, or it may be part of a traditional photolithography module (not shown) commonly found in modem semiconductor manufacturing operations. The develop station 32 may employ any type of developing solution and any type of development method, e.g., immersion, spray, puddle, spray-puddle, double-puddle, puddle-spray-puddle, etc. The develop process performed in the develop station 32 may be performed on a single wafer, on multiple wafers, or on a lot or batch basis. The develop endpoint detector 34 may be any type of tool useful for detecting the endpoint of the develop process performed in the develop station 32.

In the illustrated embodiment, the controller 36 is a computer programmed with software to implement the functions described herein. Moreover, the functions described for the controller 36 may be performed by one or Store controllers spread through the system. For example, the controller 36 may be a fab level controller that is used to control processing operations throughout all or a portion of a semiconductor manufacturing facility. Alternatively, the controller 36 may be a lower level computer that controls only portions or cells of the manufacturing facility. Moreover, the controller 36 may be a stand-alone device, or it may reside on the develop station 32, the develop endpoint detector 34 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 36, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention may be employed in connection with performing photoresist development processes on a variety of different types of photoresist material, and in connection with forming a patterned layer of photoresist 35A over a process layer 33 comprised of a vast variety of materials. For example, the process layer 33 may be comprised of any type of material commonly encountered in semiconducting processing, e.g., it may be a layer of polysilicon, a layer of metal, e.g., aluminum, or it may be a layer of insulating material, e.g., a layer of silicon dioxide, HSQ, a layer of material having a dielectric constant less than 5.0, etc. Moreover, the process layer 33 may be formed by a variety of techniques, e.g., chemical vapor deposition (CVD), physical vapor reposition (PVD), thermal growth, etc., and the thickness of the process layer 33 may vary greatly.

Similarly, the layer of photoresist 35 may be either a positive or negative type photoresist, and it may be formed by a variety of techniques, e.g., a variety of spin-coating techniques commonly employed in modern semiconductor manufacturing. Moreover, the present invention may be used in producing a patterned layer of photoresist 35A comprised of a plurality of line-type features and/or opening-type features. Corresponding line-type of opening-type features will ultimately be formed in the underlying process layer 33.

The operation of the system 30, as well as several inventive methods of the present application, will now be described. In operation, one or more wafers 31 are subjected to a develop process in the develop station 32. The develop process performed in the develop station 32 is an endpoint process, and the develop endpoint detector 34 is used to detect or declare endpoint of the develop process performed in the develop station 32. The exact parameters that govern when the develop endpoint detector 34 actually detects or declares endpoint may vary depending upon the devices under construction and the judgment of the responsible process engineer.

When the develop endpoint detector 34 senses endpoint of the develop process, it provides a signal to the controller 36. The controller 36, knowing the starting time of the develop process, then calculates or determines the duration of tie develop processes performed in the develop station 32. In some embodiments, the controller 36 may determine the duration of the develop process in absolute terms, i.e., total time, or in relative terms, i.e., a differential value to some preselected standard value or range of values.

Ultimately, the objective of the develop process performed in the develop station 32 is to produce a patterned layer of photoresist 35A while maintaining acceptable dimension and profile control of the various features formed in the patterned layer of photoresist 35A. Unfortunately, the duration of the endpoint develop process performed in the develop tool 32 may be affected by a variety of factors. For example, but not by way of limitation, the thickness (too thick or too thin) of the incoming layer of photoresist 35, the uniformity of the thickness of the layer of photoresist 35 across the wafer 31, the quality and chemical composition of the photoresist material, the stepper exposure process, the post-exposure bake process, the quality and chemical composition of the develop solution, as well as variations or degradation in various mechanical components of the develop station 32, e.g., a defective spray nozzle, may affect the duration of the develop process performed in the develop station 32.

If all processing operations performed prior to the photoresist develop step are performed in accordance with design rules established for a particular process flow, and if the develop process is performed according to the design rules, then an anticipated value, or range of acceptable values, for the duration of the endpoint develop process performed in the develop station 32 could be readily calculated or estimated for a particular process flow. Alternatively, an acceptable value, or range of values, for the duration of the endpoint develop process may be determined from empirical data. For example, the controller 36 may record the duration of the develop process performed in the develop station 32 for a large sample of wafers 31 for a particular process flow. Thereafter, based upon the ultimate acceptability of the integrated circuit devices formed, the controller 36 may determine an acceptable range of values for the duration of the endpoint develop process that corresponds with the greatest number of acceptable devices. This empirical data may be analyzed using a variety of known analytic techniques.

In any event, according to one aspect of the present invention, the controller 36 determines the duration, in an absolute or relative sense, of the endpoint develop process performed in the develop station 32. If the determined duration of the endpoint process is not within a preselected acceptable range, then the controller 36 may take various actions. In one embodiment, the controller 36 may indicate to a human operator, or other controller within a manufacturing facility, that an error condition has occurred. For example, the operator may be alerted to adjust the develop bath solution or to adjust some aspect of the developer station. Alternatively, one or more process operations may be adjusted by the controller 36 in an attempt to prevent such error conditions in the future or to try to compensate for the out-of-tolerance develop process duration.

In a more specific example, in the case of forming line-type features, e.g., gate electrodes, in the underlying process layer 33, if the duration of the endpoint develop process is greater than a desired value, or range of values, then the profile of the gate electrode structures may exhibit undercutting, i.e., the critical dimension of the gate electrodes at a point near the surface of the wafer may be less than anticipated. In this situation, the controller 36 may direct that the width of subsequently formed sidewall spacers be increased in an effort to compensate for the problems caused by over-development. Alternatively, the controller 36 may direct that the dopant dosage be decreased in subsequent ion implant processes to be performed to form source/drain regions for the device. Of course, depending upon the particular features being formed, other semiconductor processing operations may also be varied.

In another illustrative example, if the duration of the endpoint develop process is less than the desired value, or range of values, then the develop process may be incomplete, i.e., this situation may result in what is commonly referred to as photoresist scumming. This scumming may ultimately be the result of a variety of factors, such as the incoming photoresist layer 35 being too thick, a change in the chemical makeup of the photoresist material, and/or a degradation in the quality of the develop solution used during the develop process. Other potential causes of the photoresist scumming also exist. When the controller 36 determines that the duration of the develop process is less than the desired value, or range of values, it may issue an alarm or error condition, and/or it may direct that one or more process operations be varied in an effort to avoid or compensate for such photoresist scumming. As an initial matter, the controller 36 may direct that the wafers subjected to the inadequate develop process be reworked. The controller 36 may also direct that any number of process operations be inspected and/or adjusted. For example, the controller 16 may indicate that the thickness of the incoming photoresist layer 35 be reduced. The controller 36 may also indicate and direct that the chemical composition of the develop solution needs to be adjusted such that the develop process is more aggressive.

In another illustrative embodiment, the duration of the endpoint develop process may be used to predict ultimate device performance. In turn, this information may be used to control the work flow throughout the fabrication facility. For example, for a particular process flow, the duration of the develop process may be correlated with various electrical performance tests, e.g., drive current, for completed devices. The electrical test may be of the completed device, or they may be tests that are performed on the device at some point during the fabrication process. Based upon this correlation, the controller 36 may be able to predict the performance characteristics of the completed devices based upon the duration of the develop process.

As a more specific example, consider the case where the features to be formed in the process layer 33 are gate electrode structures. If the duration of the develop process is greater than a preselected desired value, or range of values, then the extended develop process would tend to produce gate electrodes having smaller than desired critical dimensions. In this situation, the completed integrated circuit device may exhibit off-state leakage currents that are higher than acceptable. Thus, when the controller 36 determines that the duration of the endpointed develop process is too long, it may predict that all devices subjected to the longer than desired develop process will result in completed devices exhibiting leakage currents of a certain value or range of values. Depending on the magnitude of the predicted leakage currents, the appropriate process engineer may decide to rework the wafer, or continue on with processing if the resulting devices, with their predicted electrical characteristics, are deemed to be acceptable for their intended use.

Figure 3:
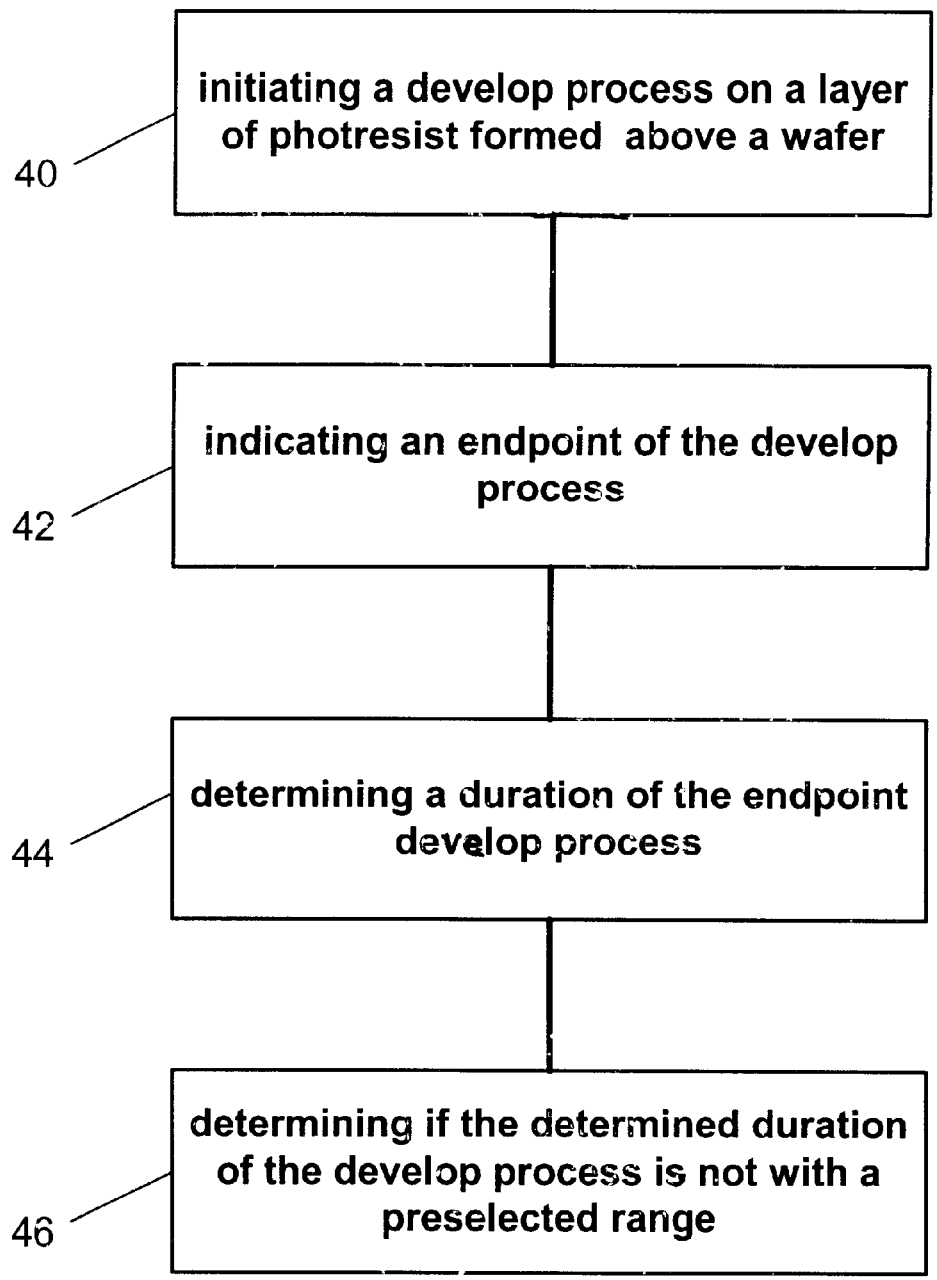
FIG. 3 is a flowchart depicting one illustrative embodiment of the present invention in flowchart form.

In one illustrative embodiment, as depicted in flowchart form in FIG. 3, the method comprises initiating a develop process on a layer of photoresist formed above a wafer, as set forth in block 40, and indicating an endpoint of the develop process, as described at block 42. The method further comprises determining a duration (absolute or relative) of the endpoint develop process, as set forth in block 44, and determining if the determined duration of the develop process is not within a preselected range, as recited in block 46. In further embodiments, the method further comprises predicting an electrical performance characteristic of an integrated circuit device to be formed on the wafer based upon the determined duration of the endpoint develop process. In yet further embodiments, the method comprises adjusting at least one parameter of a process operation if the determined duration of the develop process is not within a preselected, acceptable range of values. The process operations adjusted may be operations performed on the wafer subjected to the develop process monitored, or it may be a process operation performed on a subsequently processed wafer. In even further embodiments, the method further comprises indicating an error condition if the determined duration of the endpoint develop process is not within the preselected range.

In another aspect, the present invention is directed to a system that comprises a develop station 32 for performing a develop process on a layer of photoresist formed above a wafer, a develop endpoint detector 34 for indicating an endpoint of the develop process, and a controller 36 for determining if a duration of the develop process is not within a preselected range.

In another embodiment, the present invention is directed to a system that comprises a means for performing a develop process on a layer of photoresist formed above a wafer, a means for indicating an endpoint of the develop process, and a controller means for determining if a duration of the develop process is no within a preselected range. In the disclosed embodiment, the means for performing a develop process is the develop station 32, which may perform any of a variety of different develop methods, e.g., immersion, spray, puddle, spray-puddle, etc. In the disclosed embodiment, the means for indicating an endpoint of the develop process is the develop endpoint detector 34, and the controller means is the controller 36.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   initiating a develop process on an exposed layer of photoresist formed above a wafer;
   indicating an endpoint of said develop process;
   determining a duration of said endpoint develop process;
   determining if said determined duration of said develop process is not within a preselected range; and
   adjusting at least one parameter of at least one process operation to be performed on said wafer after said develop process has been performed if said determined duration is not within a preselected range.

2. The method of claim 1, wherein initiating a develop process on said exposed layer of photoresist formed above a wafer comprises initiating a develop process on said exposed layer of photoresist formed above a wafer, said develop process being performed in a develop station that is part of a photolithography module.

3. The method of claim 1, wherein initiating a develop process on said exposed layer of photoresist formed above a wafer comprises initiating a develop process on said exposed layer of photoresist formed above a wafer, said develop process being comprised of at least one of an immersion develop process, a spray develop process, a puddle develop process, a spray-puddle develop process, a double-puddle develop process, and a puddle-spray-puddle develop process.

4. The method of claim 1, wherein initiating a develop process on said exposed layer of photoresist formed above a wafer comprises initiating a develop process on said exposed layer of photoresist formed above a wafer, said exposed layer of photoresist comprised of at least one of a positive and a negative photoresist material.

5. The method of claim 1, wherein indicating an endpoint of said develop process comprises indicating an endpoint of said develop process through use of a develop endpoint detector tool.

6. The method of claim 1, wherein determining a duration of said endpoint develop process comprises calculating a duration of said endpoint develop process.

7. The method of claim 1, wherein determining a duration of said endpoint develop process comprises determining an absolute duration of said endpoint develop process.

8. The method of claim 1, wherein determining a duration of said endpoint develop process comprises determining a relative duration of said endpoint develop process relative to said preselected range.

9. The method of claim 1, further comprising adjusting a thickness of a layer of photoresist formed above a subsequently processed wafer if said determined duration is not within said preselected range.

10. A method, comprising:
    initiating a develop process on an exposed layer of photoresist formed above a wafer;

indicating an endpoint of said develop process;

determining a duration of said endpoint develop process; and predicting an electrical performance characteristic of an integrated circuit device to be formed on said wafer based upon said determined duration.

11. The method of claim 10, further comprising adjusting at least one parameter of at least one process operation to be performed on said wafer if said determined duration is not within a preselected range.

12. The method of claim 10, wherein initiating a develop process on said exposed layer of photoresist formed above a wafer comprises initiating a develop process on said exposed layer of photoresist formed above a wafer, said develop process being performed in a develop station that is part of a photolithography module.

13. The method of claim 10, wherein initiating a develop process on said exposed layer of photoresist formed above a wafer comprises initiating a develop process on said exposed layer of photoresist formed above a wafer, said develop process being comprised of at least one of an immersion develop process, a spray develop process, a puddle develop process, a spray-puddle develop process, a double-puddle develop process, and a puddle-spray-puddle develop process.

14. The method of claim 10, wherein initiating a develop process on said exposed layer of photoresist formed above a wafer comprises initiating a develop process on said exposed layer of photoresist formed above a wafer, said exposed layer of photoresist comprised of at least one of a positive and a negative photoresist material.

15. The method of claim 10, wherein indicating an endpoint of said develop process comprises indicating an endpoint of said develop process through use of a develop endpoint detector tool.

16. The method of claim 10, further comprising determining if said determined duration of said develop process is not within a preselected range.

17. The method of claim 16, wherein determining a duration of said endpoint develop process comprises determining an absolute duration of said endpoint develop process.

18. The method of claim 16, wherein determining a duration of said endpoint develop process comprises determining a relative duration of said endpoint develop process relative to said preselected range.

19. The method of claim 16, further comprising adjusting a thickness of a layer of photoresist formed above a subsequently processed wafer if said determined duration is not within said preselected range.

20. The method of claim 10, further comprising adjusting at least one parameter of a stepper exposure process to be performed on a layer of photoresist formed above a subsequently processed wafer if said determined duration is not within said preselected range.

21. The method of claim 10, further comprising adjusting at least one parameter of a process operation performed on at least one subsequently processed wafer if said determined duration is not within acceptable limits.

22. A method, comprising:

initiating a develop process on an exposed layer of photoresist formed above a wafer;

indicating an endpoint of said develop process;

determining a duration of said endpoint develop process;

determining if said determined duration of said develop process is not within a preselected range;

indicating an error condition if said determined duration is not within said preselected range; and adjusting a thickness of a layer of photoresist formed above a subsequently processed wafer if said determined duration is not within said preselected range.

23. The method of claim 22, further comprising adjusting at least one parameter of at least one process operation to be performed on said wafer if said determined duration is not within a preselected range.

24. The method of claim 22, further comprising predicting an electrical performance characteristic of an integrated circuit device to be formed on said wafer based upon said determined duration.

25. The method of claim 22, wherein initiating a develop process on said exposed layer of photoresist formed above a wafer comprises initiating a develop process on said exposed layer of photoresist formed above a wafer, said develop process being performed in a develop station that is part of a photolithography module.

26. The method of claim 22, wherein initiating a develop process on said exposed layer of photoresist formed above a wafer comprises initiating a develop process on said exposed layer of photoresist formed above a wafer, said develop process being comprised of at least one of an immersion develop process, a spray develop process, a puddle develop process, a spray-puddle develop process, a double-puddle develop process, and a puddle-spray-puddle develop process.

27. The method of claim 22, wherein initiating a develop process on said exposed layer of photoresist formed above a wafer comprises initiating a develop process on said exposed layer of photoresist formed above a wafer, said exposed layer of photoresist comprised of at least one of a positive and a negative photoresist material.

28. The method of claim 22, wherein indicating an endpoint of said develop process comprises indicating an endpoint of said develop process through use of a develop endpoint detector tool.

29. The method of claim 22, wherein determining a duration of said endpoint develop process comprises calculating a duration of said endpoint develop process.

30. The method of claim 22, wherein determining a duration of said endpoint develop process comprises determining an absolute duration of said endpoint develop process.

31. The method of claim 22, wherein determining a duration of said endpoint develop process comprises determining a relative duration of said endpoint develop process relative to said preselected range.

32. A method, comprising:

initiating a develop process on an exposed layer of photoresist formed above a wafer;

indicating an endpoint of said develop process;

determining a duration of said endpoint develop process;

determining if said determined duration of said develop process is not within a preselected range; and adjusting a thickness of a layer of photoresist formed above a subsequently processed wafer if said determined duration is not within said preselected range.

33. A method, comprising:

initiating a develop process on an exposed layer of photoresist formed above a wafer;

indicating an endpoint of said develop process;

determining a duration of said endpoint develop process;

determining if said determined duration of said develop process is not within a preselected range; and adjusting at least one parameter of a stepper exposure process to be performed on a layer of photoresist formed above a subsequently processed wafer if said determined duration is not within said preselected range.

34. A method, comprising:

initiating a develop process on an exposed layer of photoresist formed above a wafer;

indicating an endpoint of said develop process;

determining a duration of said endpoint develop process;

determining if said determined duration of said develop process is not within a preselected range;

indicating an error condition if said determined duration is not within said preselected range; and adjusting at least one parameter of a stepper exposure process to be performed on a layer of photoresist formed above a subsequently processed wafer if said determined duration is not within said preselected range.

35. A method, comprising:

initiating a develop process on an exposed layer of photoresist formed above a wafer;

indicating an endpoint of said develop process;

determining a duration of said endpoint develop process;

determining if said determined duration of said develop process is not within a preselected range;

indicating an error condition if said determined duration is not within said preselected range; and adjusting at least one parameter of a process operation performed on said processed wafer after said develop process has been performed if said determined duration is not within acceptable limits.

* * * * *